(12) United States Patent
Kim et al.

(10) Patent No.: US 11,193,061 B2
(45) Date of Patent: Dec. 7, 2021

(54) SEMICONDUCTOR NANOCRYSTAL PARTICLES AND DEVICES INCLUDING THE SAME

(71) Applicant: SAMSUNG ELECTRONICS CO., LTD., Suwon-si (KR)

(72) Inventors: Sung Woo Kim, Hwaseong-si (KR); Jin A Kim, Suwon-si (KR); Tae Hyung Kim, Seoul (KR); Jeong Hee Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 211 days.

(21) Appl. No.: 16/196,117

(22) Filed: Nov. 20, 2018

(65) Prior Publication Data

US 2019/0153317 A1 May 23, 2019

(30) Foreign Application Priority Data

Nov. 20, 2017 (KR) .................. 10-2017-0155162

(51) Int. Cl.
*C09K 11/88* (2006.01)
*C09K 11/56* (2006.01)
*H01L 51/50* (2006.01)

(52) U.S. Cl.
CPC .......... *C09K 11/883* (2013.01); *C09K 11/565* (2013.01); *H01L 51/502* (2013.01)

(58) Field of Classification Search
CPC .... C09K 11/883; C09K 11/565; H01L 51/502
USPC ....................................................... 252/586
See application file for complete search history.

(56) References Cited

U.S. PATENT DOCUMENTS

| 7,829,189 | B2 | 11/2010 | Jang et al. |
| 8,313,714 | B2 | 11/2012 | Asokan et al. |
| 9,493,351 | B2 | 11/2016 | Zhong et al. |
| 2005/0214536 | A1* | 9/2005 | Schrier ............... H01L 33/28 428/403 |
| 2012/0103404 | A1* | 5/2012 | Fuke ................... H01G 9/2031 136/255 |
| 2014/0117292 | A1* | 5/2014 | Jun .................... H01L 31/0304 252/519.14 |

FOREIGN PATENT DOCUMENTS

KR 100442775 B1 7/2004

* cited by examiner

*Primary Examiner* — Ling Siu Choi
*Assistant Examiner* — Ronald Grinsted
(74) *Attorney, Agent, or Firm* — Cantor Colburn LLP

(57) ABSTRACT

A quantum dot comprising a core comprising a first semiconductor nanocrystal comprising zinc, selenium, and optionally tellurium; and a shell disposed on the core and comprising a second semiconductor nanocrystal having a different composition from the first semiconductor nanocrystal, and comprising zinc and at least one of sulfur and selenium, wherein the shell comprises at least three branches extending from the core, wherein at least one of the branches has a length of greater than or equal to about 2 nm, the quantum dot emits blue light comprising a maximum emission peak at a wavelength of less than or equal to about 470 nm, a full width at half maximum (FWHM) of the maximum emission peak is less than about 35 nm, and the quantum dot does not comprise cadmium.

20 Claims, 16 Drawing Sheets
(2 of 16 Drawing Sheet(s) Filed in Color)

SEMICONDUCTOR NANOCRYSTAL PARTICLES AND DEVICES INCLUDING THE SAME

CROSS-REFERENCE TO RELATED APPLICATION

This application claims priority to and the benefit of Korean Patent Application No. 10-2017-0155162 filed in the Korean Intellectual Property Office on Nov. 20, 2017, and all the benefits accruing therefrom under 35 U.S.C. § 119, the entire contents of which are incorporated herein by reference.

BACKGROUND

1. Field

A semiconductor nanocrystal particle and a device including the same are disclosed.

2. Description of the Related Art

Physical characteristics (e.g., energy bandgaps, etc.) of nanoparticles are intrinsic characteristics that may be controlled by changing particle sizes, unlike bulk materials. For example, semiconductor nanocrystal particles (also known as quantum dots) are a crystalline material having a particle size of several nanometers. Such semiconductor nanocrystal particles have a small particle size that provides a large surface area per unit volume and exhibits quantum confinement effects, and thus have different properties from the characteristics of bulk materials having the same compositions. Quantum dots may absorb light from an excitation source to be excited, and may emit energy corresponding to its energy bandgap.

Quantum dot may be synthesized using a vapor deposition method of metal organic chemical vapor deposition (MOCVD), molecular beam epitaxy (MBE), or the like, or synthesized by a wet chemical method of adding precursor materials to an organic solvent to grow crystals, or the like. In the wet chemical method, organic compounds such as ligands or coordinating solvents may be coordinated on surfaces of nanocrystals to control the crystal growth.

In order to improve photoluminescence properties of quantum dots, a core-shell structure has been used, but the core-shell quantum dots having improved properties are typically cadmium-based materials. Accordingly, there remains a need for development of cadmium-free semiconductor nanocrystal particles having desirable photoluminescence properties.

SUMMARY

An embodiment provides a cadmium-free quantum dot capable of emitting blue light with improved efficiency.

Another embodiment provides a method of manufacturing the quantum dot.

Yet another embodiment provides an electronic device including the quantum dot.

In an embodiment, a quantum dot includes a core including a first semiconductor nanocrystal including zinc, selenium, and optionally tellurium; and a shell disposed on the core and including a second semiconductor nanocrystal having a different composition from the first semiconductor nanocrystal, and including zinc and at least one of sulfur and selenium, wherein the shell includes at least three branches (e.g., extending from the core), wherein at least one of the branches has a length of greater than or equal to about 2 nanometers (nm) (e.g., as measured from the core) (e.g., greater than about 2 nm, greater than or equal to about 3 nm, or greater than or equal to about 4 nm), the quantum dot emits blue light including a maximum emission peak t a wavelength of less than or equal to about 470 nm, a full width at half maximum (FWHM) of the maximum emission peak is less than about 35 nm, and the quantum dot does not include cadmium.

The first semiconductor nanocrystal may include ZnSe, $ZnTe_xSe_{1-x}$ (wherein, x is greater than 0 and less than or equal to 0.1 or less than or equal to 0.05), or a combination thereof.

A particle size of the core may be greater than or equal to about 1.9 nm.

A particle size of the core may be less than about 3.5 nm (e.g., less than or equal to about 3.0 nm).

The shell may include ZnSe, ZnS, ZnSeS, or a combination thereof.

In the quantum dot, a mole ratio of tellurium relative to selenium may be less than or equal to about 0.03.

In the quantum dot, a mole ratio of tellurium relative to zinc may be less than or equal to about 0.03.

The branches may have a composition that changes in a length direction from the core.

The branches may have a composition where a sulfur content is increased along a length direction from the core.

The branches may have an average length of greater than or equal to about 3 nm.

The branches may have an average length of greater than or equal to about 4 nm.

The quantum dot may have a maximum emission peak at a wavelength of greater than or equal to about 440 nm (e.g., greater than about 440 nm or greater than or equal to about 442 nm) and less than or equal to about 470 nm (e.g., less than or equal to about 466 nm, or less than or equal to about 460 nm).

The quantum dot may have a full width at half maximum (FWHM) of the maximum emission peak of less than or equal to about 35 nm (e.g., less than or equal to about 25 nm).

A full width at half maximum (FWHM) of the maximum emission peak may be less than or equal to about 20 nm (e.g., less than about 20 nm, less than or equal to about 19 nm, less than or equal to about 18 nm, less than or equal to about 17 nm, or less than or equal to about or 16 nm).

The quantum dot may have quantum efficiency of greater than or equal to about 60% (e.g., greater than or equal to about 70%).

The core and the shell may have a zinc blend crystal structure.

In another embodiment, a method of producing the quantum dot includes providing an organic ligand solution including a first organic ligand including a carboxylic acid compound and a primary amine compound, and a first organic solvent;

heating the organic ligand solution to a first temperature under an inert atmosphere;

providing a precursor stock solution including a zinc precursor, a selenium precursor, and optionally a tellurium precursor, and a second organic solvent;

adding the precursor stock solution to the organic ligand solution heated to the first temperature to obtain a first reaction mixture;

heating the first reaction mixture to a first reaction temperature to obtain a core including a first semiconductor nanocrystal;

providing a first shell precursor solution including a zinc-containing first shell precursor, a second organic ligand, and a third organic solvent;

providing a second shell precursor including at least one of sulfur and selenium; and heating the first shell precursor solution and adding the core and the second shell precursor thereto to form a shell of a second semiconductor nanocrystal on the core.

The organic ligand solution may not include a source of a quaternary ammonium or phosphonium compound (e.g., cetyltrimethylammonium bromide, didecyldimethylammonium bromide, etc.).

The organic ligand solution may not include a zinc compound.

The organic ligand may not include a source of a quaternary ammonium or phosphonium compound.

The zinc precursor may include a Zn metal powder, an alkylated Zn compound, a Zn halide, a Zn cyanide, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof.

The tellurium precursor may include tellurium-tributylphosphine (Te-TBP), tellurium-triphenylphosphine (Te-TPP), tellurium-diphenylphosphine (Te-DPP), tellurium-trioctylphosphine (Te-TOP), or a combination thereof.

The zinc-containing first shell precursor may include a Zn metal powder, ZnO, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, or a combination thereof.

The second shell precursor may include selenium-trioctylphosphine (Se-TOP), selenium-tributylphosphine (Se-TBP), selenium-triphenylphosphine (Se-TPP), selenium-diphenylphosphine (Se-DPP), tellurium-tributylphosphine (Te-TBP), tellurium-triphenylphosphine (Te-TPP), tellurium-diphenylphosphine (Te-DPP), tellurium-diphenylphosphine (Te-DPP), or a combination thereof.

When the tellurium precursor is used, an amount of the selenium precursor may be greater than or equal to about 20 moles based on 1 mole of the tellurium precursor. When the tellurium precursor is used, an amount of the selenium precursor may be less than or equal to about 60 moles (e.g., greater than or equal to about 1 mole, greater than or equal to about 5 moles, greater than or equal to about 10 moles, or greater than or equal to about 20 moles and less than or equal to about 60 moles, less than or equal to about 50 moles, less than or equal to about 40 moles, or less than or equal to about 30 mol) based on 1 mole of the tellurium precursor.

The first temperature may be greater than or equal to about 100° C. and less than or equal to about 300° C.

The first reaction temperature may be greater than or equal to about 280° C. to and less than or equal to about 340° C.

The first reaction temperature may be higher than the first temperature.

The shell may be formed at a second reaction temperature and the second reaction temperature may be about 300° C. to about 340° C.

The carboxylic acid compound may include a C5 to C30 aliphatic hydrocarbon group.

The primary amine compound may include a C5 to C30 aliphatic hydrocarbon group.

The second organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, R$_2$POOH (wherein, R and R' are independently a C1 to C40 aliphatic hydrocarbon, a C6 to C40 aromatic hydrocarbon, or combination thereof), or a combination thereof.

Another embodiment provides an electronic device including the quantum dot.

The electronic device may be a display device, a light emitting diode (LED), a quantum dot light emitting diode (QLED), an organic light emitting diode (OLED), a sensor, an image sensor, or a solar cell electronic device.

A cadmium-free semiconductor nanocrystal particle capable of emitting blue light is provided. The semiconductor nanocrystal particle may be applied to various display devices, biolabeling (e.g., a biosensor or bioimaging), a photodetector, a solar cell, a hybrid composite, and the like.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings.

DETAILED DESCRIPTION

Figure 1:
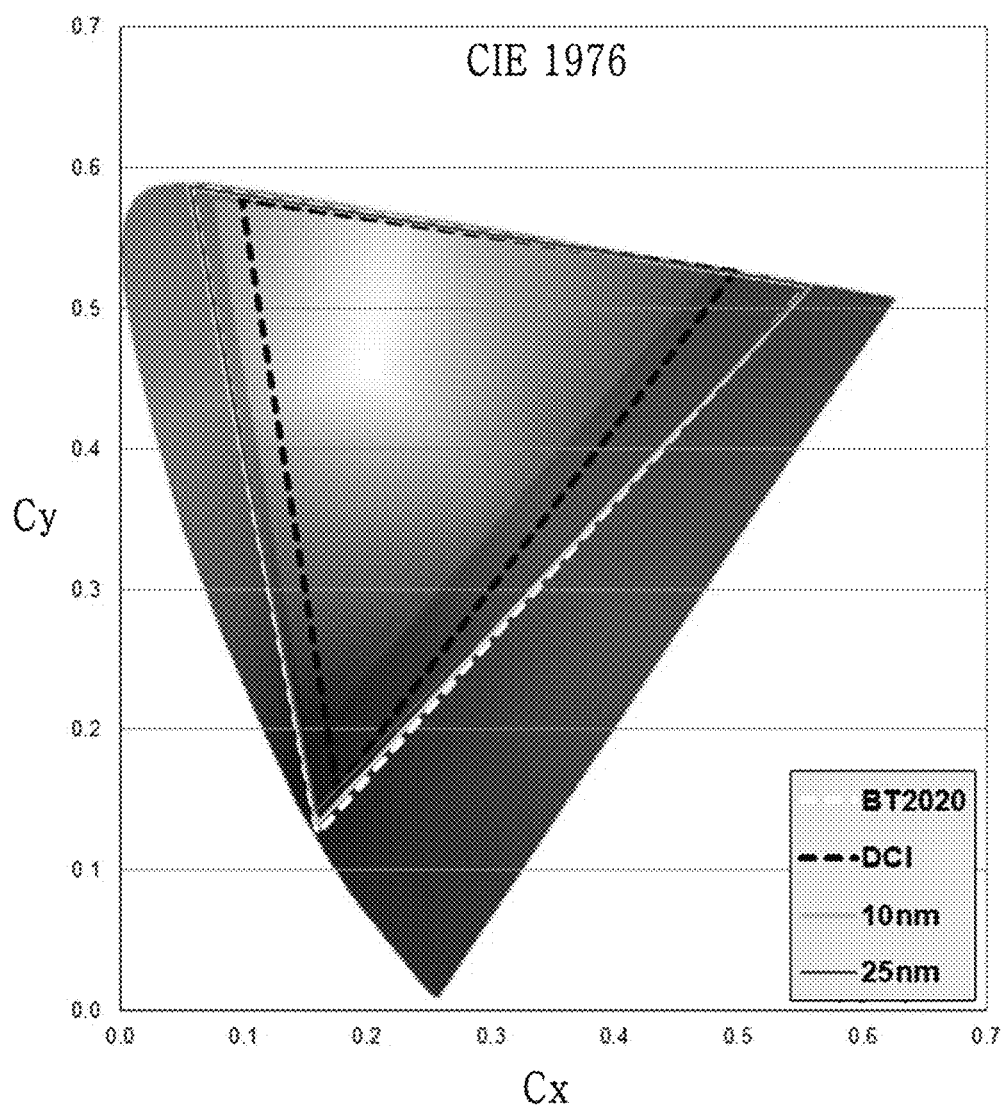
FIG. 1 is a color graph of color coordinate (Cy) versus color coordinate (Cx), showing an area ratio change depending on a full width at half maximum (FWHM) under a BT2020 standard in a CIE 1976 color coordinate.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of the hydrogen atoms thereof is replaced by a substituent provided that the substituted atom's normal valence is not exceeded, selected from a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, a "hydrocarbon group" refers to a group including carbon and hydrogen (e.g., an alkyl, alkenyl, alkynyl, or aryl group). The hydrocarbon group may be a group having a monovalency or greater, for example a monovalent, divalent, or tetravalent group, formed by removal of one or more hydrogen atoms from, for example, an aliphatic or aromatic hydrocarbon such as alkane, alkene, alkyne, or arene. In the hydrocarbon group, at least one methylene moiety (—CH$_2$—) may be replaced by an oxide moiety (—O—), a carbonyl moiety (—C=O—), an ester moiety (—COO— or —OCO—), an amino moiety —NH—, or a combination thereof. Alternatively, the hydrocarbon group may consist of carbon and hydrogen.

Herein, "aliphatic" refers to a saturated or unsaturated linear or branched hydrocarbon group having at least one carbon atoms (e.g., 1 to 40 carbon atoms, 5 to 35 carbon atoms, or 6 to 24 carbon atoms). An aliphatic group may be an alkyl, alkenyl, or alkynyl group, for example.

Herein, "alkyl" refers to a linear or branched saturated monovalent hydrocarbon group (methyl, ethyl hexyl, or the like).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to an aromatic hydrocarbon and means a cyclic moiety including carbon atoms in which at least one ring is aromatic, the moiety having the specified number of carbon atoms, specifically 6 to 40 carbon atoms, more specifically 6 to 24 carbon atoms. More than one ring may be present, and any additional rings may be independently aromatic, saturated or partially unsaturated, and may be fused, pendant, spirocyclic or a combination thereof. The term "aryl" may include a heteroaryl group including at least one heteroatom. Alternatively, in the aryl group, all ring members may be carbon. The aryl group may be formed by removal of at least one hydrogen from an aromatic group (e.g., a phenyl or naphthyl group).

As used herein, "cycloalkyl" refers to a group that comprises one or more saturated and/or partially saturated rings in which all ring members are carbon, such as cyclopropyl, cyclobutyl, cyclopentyl, cyclohexyl, cycloheptyl, cyclooctyl, adamantyl, and partially saturated variants of the foregoing, such as cycloalkenyl groups (e.g., cyclohexenyl) or cycloalkynyl groups. Cycloalkyl groups may not include an aromatic ring or a heterocyclic ring. When the numbers of carbon atoms is specified (e.g., C3 to C15 cycloalkyl), the number means the number of ring members present in the one or more rings.

Herein, an "amine" group may have a general formula —NRR, wherein each R is independently hydrogen, an alkyl group, or an aryl group, but is not limited thereto. "Primary amine" may be an amine having the formula $RNH_2$, wherein R is hydrogen, an alkyl group, or an aryl group, but is not limited thereto. "Secondary amine" may be an amine having the formula RR'NH, wherein R and R' are each independently an alkyl group, an aryl group, or the like, but is not limited thereto. "Tertiary amine" may be an amine having the formula RR'R"N, wherein R, R', and R" are each independently an alkyl group, an aryl group, or the like, but is not limited thereto. "Amino" refers to a moiety derived from the amine and may have the general formula $-N(R)_2$, wherein each R is independently hydrogen, a C1 to C30 alkyl, or a C6 to C40 aryl, but is not limited thereto.

Herein, "hetero" refers to one including 1 to 3 heteroatoms that may be N, O, S, Si, P, or a combination thereof.

Herein, "heterocyclic" refers to a cyclic group comprising at least one ring member that is a heteroatom. If multiple rings are present, each ring is independently aromatic, saturated or partially unsaturated and multiple rings, if present, may be fused, pendant, spirocyclic or a combination thereof. Heterocycloalkyl groups comprise at least one non-aromatic ring that contains a heteroatom ring member. Heteroaryl groups comprise at least one aromatic ring that contains a heteroatom ring member. Non-aromatic and/or carbocyclic rings may also be present in a heteroaryl group, provided that at least one ring is both aromatic and contains a ring member that is a heteroatom.

Herein, "phosphine" has the general formula $P(R)_3$, wherein each R is independently hydrogen, an aliphatic group (e.g., alkyl or alkenyl) group, or an aromatic group.

Herein, "phosphine oxide" has the general formula $PO(R)_3$, wherein each R is independently hydrogen, an aliphatic group (e.g., alkyl or alkenyl) or an aromatic group.

Herein, "Group" refers to a group of Periodic Table.

As used herein, the term "quantum yield" (QY) or the term "quantum efficiency (QE) is a value determined from a photoluminescence (PL) spectrum obtained by dispersing quantum dots in an appropriate solvent (e.g., toluene or hexane), and may be calculated with respect to the photoluminescent peak of an organic solution of a reference dye (e.g., an ethanol solution of an appropriate dye having an appropriate absorption (optical density) at a predetermined wavelength). As used herein, the term "quantum yield (QY)" and the term "quantum efficiency (QE)" may have substantially the same meaning and can be used interchangeably.

A quantum dot (hereinafter, also referred to as a semiconductor nanocrystal particle) may absorb light from an excitation source and may emit energy corresponding to their energy bandgap. Energy bandgaps of quantum dots may be varied with the particle size and composition of the nanocrystal. For example, as the particle size of the quantum dot increases, its energy bandgap may become narrower and its light emitting wavelength may increase. Semiconductor nanocrystals have drawn attention as a light emitting material in various fields of a display device, an energy device, or a bio light emitting device.

Most of the quantum dots having a photoluminescence (PL) property at an actually applicable level are based on cadmium (Cd). Cadmium causes severe environment/health problems and is one of the restricted elements via Restriction of Hazardous Substances Directive (RoHS) in many countries. Accordingly, there are needs for development of a cadmium-free quantum dot having improved photoluminescence characteristics. In order to be applied to a QLED display device, a quantum dot having a relatively narrow full width at half maximum (FWHM) and capable of emitting light of a desired wavelength (e.g., pure blue having a PL peak wavelength around 430-455 nm) may be desired. For example, a blue light emitting material having a narrow full width at half maximum (FWHM) may be required in order to be applied to a display device having a relatively high (e.g., about 90% or greater) color reproducibility based on the next generation color standard BT2020. However, a cadmium-free quantum dot having photoluminescence properties at an actually applicable level and the aforementioned PL peak wavelength is not easy to prepare and has not been reported yet.

A quantum dot according to an embodiment has the following structure and the following composition, thereby emitting blue light and having desirable properties without including cadmium. The quantum dot may be a core-shell type quantum dot having a core and a shell disposed on the core.

The quantum dot includes a core including a first semiconductor nanocrystal including zinc, selenium, and optionally, tellurium; and a shell disposed on the core and including a second semiconductor nanocrystal having a different composition from that of the first semiconductor nanocrystal and including zinc and at least one of sulfur and selenium (or both sulfur and selenium). The quantum dot emits blue light having a maximum emission peak at a wavelength of less than or equal to about 470 nanometers (nm), and the maximum emission peak has a full width at half maximum (FWHM) of less than about 35 nm. The quantum dot may have luminous efficiency of greater than about 65%.

The first semiconductor nanocrystal of the core may include ZnSe or a ZnSe-based material (ZnSeTe) including a small amount of tellurium (Te), or both. The core may have a cubic (zinc blend) crystal structure. The core may include $ZnTe_xSe_{1-x}$, wherein x is greater than 0, for example, greater than or equal to about 0.0001, greater than or equal to about 0.0005, or greater than or equal to about 0.001 and less than or equal to about 0.1, for example, less than or equal to about 0.09, less than or equal to about 0.08, less than or equal to about 0.07, less than or equal to about 0.06, or less than or equal to about 0.05. In the core, the wavelength of the maximum emission peak of the semiconductor nanocrystal particle may be shifted into a longer wavelength region by increasing a ratio of an amount of tellurium relative to an amount of selenium. In the core, the amount of the tellurium may be greater than or equal to about 0.0001 mole, greater than or equal to about 0.0005 moles, greater than or equal to about 0.0006 moles, greater than or equal to about 0.0007 moles, greater than or equal to about 0.0008 moles, greater than or equal to about 0.0009 moles, greater than or equal to about 0.001 mole, greater than or equal to about 0.0015 moles, or greater than or equal to about 0.002 based on 1 mole of the selenium. In the core, the amount of the tellurium may be less than or equal to 0.06 moles, for example less than or equal to about 0.053 moles, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 moles, less than or equal to about 0.03 moles, less than or equal to about 0.02 moles, less than or equal to about 0.01 moles, less than or equal to about 0.009 moles, less than or equal to about 0.008 moles, or less than or equal to about 0.007 moles. Without being bound by any particular theory, the core may have various forms in terms of distributions of Zn, Se, and Te. For example, in the core, ZnSe may surround ZnTe. In the core, Te may be dispersed in a ZnSe crystal structure. Te may be distributed at the surface in the ZnSe crystal structure. The ZnTe and the ZnSe may form a random domain.

In an embodiment, the second semiconductor nanocrystal of the shell includes zinc (Zn), and at least one chalcogen element selected from selenium (Se) and sulfur (S). For example, the second semiconductor nanocrystal may include ZnSe, ZnS, ZnSeS, or a combination thereof.

When the quantum dot includes tellurium, a ratio of a mole amount of the tellurium relative to that of selenium in the quantum dot (e.g., measured by inductively coupled plasma-atomic emission spectroscopy (ICP-AES)) may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, less than or equal to about 0.01, less than or equal to about 0.009, less than or equal to about 0.008, or less than or equal to about 0.007. A mole ratio of the tellurium relative to selenium in the quantum dot may be greater than or equal to about 0.0001, greater than or equal to about 0.0005, greater than or equal to about 0.001, greater than or equal to about 0.002, greater than or equal to about 0.003, or greater than or equal to about 0.004. The mole ratio of the tellurium relative to selenium in the quantum dot may be about 0.001 to about 0.025.

In the quantum dot, an amount of the zinc may be larger than that of the selenium. Through an ICP-AES analysis of the quantum dot, it may be confirmed that an amount of zinc (Zn) may be larger than that of selenium (Se) and an amount of selenium may be larger than that of tellurium For example, (in an ICP-AES analysis) a mole ratio of Se relative to Zn in the quantum dot may be less than about 1, for example, less than or equal to about 0.95, less than or equal to about 0.90, less than or equal to about 0.85, less than or equal to about 0.8, less than or equal to about 0.75, less than or equal to about 0.7, less than or equal to about 0.65, less than or equal to about 0.6, less than or equal to about 0.55, less than or equal to about 0.5, less than or equal to about 0.45, or less than or equal to about 0.4. For example, (in an ICP-AES analysis) the mole ratio of Se relative to Zn in the quantum dot may be greater than or equal to about 0.1 or greater than or equal to about 0.2.

A mole ratio of Te relative to Zn (e.g., determined by an inductively coupled plasma-atomic emission spectroscopy) in the quantum dot may be less than or equal to about 0.03, for example, less than or equal to about 0.027, less than or equal to about 0.025, less than or equal to about 0.02, less than or equal to about 0.019, less than or equal to about 0.018, less than or equal to about 0.017, 0.016, less than or equal to about 0.015, less than or equal to about 0.01, less than or equal to about 0.009, less than or equal to about 0.008, less than or equal to about 0.007, less than or equal to about 0.006, or less than or equal to about 0.005. A mole ratio of Te relative to Zn in the quantum dot may be greater than or equal to about 0.0001, for example, greater than or equal to about 0.0005, or greater than or equal to about 0.001. The quantum dot may not include cadmium. The quantum dot may not include a heavy metal such as lead, cadmium, or mercury.

In the quantum dot, a mole ratio of sulfur relative to Zn may be greater than or equal to about 0.1, for example greater than or equal to about 0.15 or greater than or equal to about 0.2. In the quantum dot, a mole ratio of sulfur relative to Zn may be less than or equal to about 0.9, less than or equal to about 0.8, less than or equal to about 0.7, or less than or equal to about 0.6. In the quantum dot, a mole ratio of Se+S relative to zinc may be greater than or equal to about 0.3, greater than or equal to about 0.4, or greater than or equal to about 0.5. In the quantum dot, a mole ratio of Se+S relative to zinc may be less than or equal to about 1, for example less than about 1, or less than or equal to about 0.95.

A particle size of the quantum dot may be less than or equal to about 50 nm, for example less than or equal to about 45 nm, less than or equal to about nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm. The particle size of the quantum dot may be greater than or equal to about 5 nm, for example, greater than or equal to about 6 nm. The particle size of the quantum dot may be measured as the largest linear length crossing the particle.

An average particle size of the core of the quantum dot may be greater than or equal to about 1.9 nm, for example, greater than or equal to about 2 nm. The average particle size of the core may be less than or equal to about 3 nm. The core having the particle size within the aforementioned range may contribute to forming a shell including a branch on the surface. The branch may grow toward a (111) facet direction of the core. In the quantum dot, both the core and the shell all may have a zinc blend (cubic) crystal structure.

The quantum dot has a multipod shape including a plurality of branches. As used herein, a branch may be a portion of shell material that protrudes or extends in a direction away from the core. For example, the shell of the quantum dot may include a plurality of branches and a valley connecting adjacent braches. The multipod includes greater than or equal to about 3 (e.g., greater than or equal to 4) branches. The quantum dot may have a tetrapod shape (i.e., 4 branches). At least one of the branches may have a length of greater than or equal to about 2 nm, for example, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, even greater than or equal to about 10 nm (e.g., as measured from the core). The branches may have an average length of greater than or equal to about 3 nm, for example, greater than or equal to about 3.1 nm, greater than or equal to about 3.15 nm, greater than or equal to about 3.5 nm, greater than or equal to about 4 nm, greater than or equal to about 4.5 nm, greater than or equal to about 4.68 nm, greater than or equal to about 5 nm, or greater than or equal to about 5.1 nm. A quantum dot having a branch having the average length within the aforementioned range may show a narrower full width at half maximum (FWHM) at a desired maximum emission peak wavelength. A thickness of the branches is not particularly limited and may be greater than or equal to about 1 nm, for example, greater than or equal to about 1.5 nm, greater than or equal to about 2 nm, greater than or equal to about 2.5 nm, greater than or equal to about 3 nm, or greater than or equal to about 3.5 nm. The thickness of the branches may be less than or equal to about 5 nm, for example, less than or equal to about 4.5 nm, or less than or equal to about 4 nm but is not limited thereto. The thickness is the direction perpendicular to the length of the branch.

The second semiconductor nanocrystal of the branches may have a shell composition changing along a direction of its length, e.g. a gradient in a direction extending from the core. For example, the second semiconductor nanocrystal of the branches may have a composition of ZnSeS (for the core)/ZnS (for the shell), and the end portion of the branches may have an increased sulfur content, and this may be confirmed for example from the element mapping analysis result of the energy dispersive spectroscopy.

In order to realize a quantum dot based electroluminescent device with an improved image quality and high color reproducibility, a quantum dot having desired photoluminescence characteristics may be necessary. Most of the quantum dot showing desired photoluminescence characteristics are based on cadmium. For example, a cadmium-free quantum dot having desired luminous efficiency and emitting blue light of a full width at half maximum (FWHM) has not been reported yet. On the other hand, an electroluminescent device uses DCI color space and BT2020 color space as a color reproducibility standard. The BT2020 standard is regarded as a next generation standard for a display device, and in order to realize improved color reproducibility under this standard, higher color purity (e.g., a narrower full width at half maximum (FWHM)) and a light emitting wavelength of a predetermined range may be required. In an embodiment, as for blue light, at a desired maximum photoluminescence peak wavelength, a full width at half maximum (FWHM) of a light emitting material may have a substantial influence on color reproducibility of a device. Specifically, FIG. 1 shows an area ratio change according to a full width at half maximum (FWHM) of blue light under each different reference color space. Based on the result of FIG. 1, a light emitting material having a narrower full width at half maximum (FWHM) than DCI is required to realize satisfactory color reproducibility under the next generation standard of BT2020. However, a quantum dot capable of realizing a full width at half maximum (FWHM) of less than or equal to about 30 nm as a cadmium-free based quantum dot emitting blue light (e.g., less than or equal to 25 nm or less than or equal to 20 nm) has not been reported yet.

A quantum dot having the aforementioned composition and the aforementioned shape according to an embodiment may have a relatively narrow full width at half maximum (FWHM) and emit blue light having a desired wavelength. A maximum photoluminescence (PL) peak wavelength of the quantum dot may be greater than or equal to about 430 nm (e.g., greater than or equal to about 440 nm, greater than or equal to about 445 nm, or greater than or equal to about 450 nm) and less than or equal to about 470 nm (e.g., less than about 470 nm, less than or equal to about 465, nm or less than or equal to about 460 nm). The blue light may have a maximum photoluminescence peak wavelength of about 440 nm to about 460 nm or about 450 nm to about 460 nm. A full width at half maximum (FWHM) of the emission peak of the quantum dot may be less than about 35 nm, for example, less than or equal to about 30 nm, less than or equal to about 25 nm, less than or equal to about 24 nm, less than or equal to about 23 nm, less than or equal to about 22 nm, less than or equal to about 21 nm, less than or equal to about nm, less than or equal to about 19 nm, less than or equal to about 18 nm, or less than or equal to about 17 nm.

The quantum dot may have quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, or greater than or equal to about 69%. The semiconductor nanocrystal may have quantum efficiency of greater than or equal to about 70%, greater than or equal to about 80%, greater than or equal to about 90%, greater than or equal to about 95%, greater than or equal to about 99%, or about 100%.

In another embodiment, a method of producing the quantum dot according to an embodiment includes, providing, for example preparing, an organic ligand solution including a first organic ligand including a carboxylic acid compound and a primary amine compound, and a first organic solvent;

heating the organic ligand solution to a first temperature under an inert atmosphere;

providing, for example preparing, a precursor stock solution including a zinc precursor, a selenium precursor, and optionally a tellurium precursor, and a second organic solvent;

adding, for example injecting, the precursor stock solution into the organic ligand solution heated to the first temperature to obtain a first reaction mixture;

heating the first reaction mixture to a first reaction temperature to obtain a core including a first semiconductor nanocrystal;

providing, for example preparing, a first shell precursor solution including a zinc-containing first shell precursor, a second organic ligand, and a third organic solvent;

providing, for example preparing, a second shell precursor including at least one of sulfur and selenium; and heating the first shell precursor solution and adding the core and the second shell precursor thereto to form a shell of a second semiconductor nanocrystal on the core. The shell may be formed at a second reaction temperature.

The method may exclude a use of a source of a quaternary ammonium or phosphonium compound (e.g., cetyltrimethylammonium bromide, didecyldimethylammonium bromide). For example, the organic ligand solution, the reaction mixture, and/or the first shell precursor solution may not include a source of a quaternary ammonium or phosphonium compound (e.g., cetyltrimethylammonium bromide, didecyldimethylammonium bromide, or the like). The organic ligand solution may not include a zinc compound. The first organic ligand may not include a source of a quaternary ammonium or phosphonium compound.

In an embodiment, the carboxylic acid compound may include a C5 to C30 aliphatic hydrocarbon group. For example, the carboxylic acid compound may be a monocarboxylic acid compound. For example, the carboxylic acid compound may include pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid, tetra-triacontanoic acid, pentatriacontanoic acid, hexatriacontanoic acid, alpha linolenic acid, eicosapentaenoic acid, docosahexaenoic acid, linolenic acid, gamma-linolenic acid, dihomo-gamma-linolenic acid, arachidonic acid, paullinic acid, oleic acid, elaidic acid, eicosenoic acid, erucic acid, nervonic acid, or a combination thereof.

In an embodiment, the primary amine compound may include a C5 to C30 aliphatic hydrocarbon group. For example, the primary amine compound may include pentylamine, hexylamine, heptylamine, octylamine, nonylamine, decylamine, undecylamine, dodecylamine, tridecylamine, pentadecylamine, hexadecylamine, heptadecylamine, octadecylamine, nonadecylamine, oleylamine, or a combination thereof.

In an embodiment, the first organic solvent is not particularly limited and may be desirably selected. The first organic solvent may include a secondary amine (e.g., dioctylamine, dinonylamine, etc.) having at least one C6 to C40 aliphatic hydrocarbon group (e.g., alkyl group, an alkenyl group, or an alkynyl group), a tertiary amine (e.g., trioctylamine, etc.) having at least one C6 to C40 aliphatic hydrocarbon group (e.g., alkyl group, an alkenyl group, or an alkynyl group), a nitrogen-containing heterocyclic compound such as pyridine, a C6 to C50 aliphatic hydrocarbon (e.g., a C6 to C40 alkene solvent such as octadecene, an alkane solvent such as hexadecane, octadecane, squalene, etc.), a C6 to C60 aromatic hydrocarbon (e.g., aromatic hydrocarbon substituted with a C6 to C30 alkyl group such as phenyldodecane, phenyltetradecane, phenyl hexadecane), primary, secondary, or tertiary phosphine compound (e.g. trioctylphosphine) having at least one (e.g., 1, 2, or 3) C6 to C22 alkyl group, a primary, secondary, or tertiary phosphine oxide compound (e.g. trioctylphosphine oxide) having a C6 to C22 alkyl group, a C12 to C22 aromatic ether such as phenyl ether or benzyl ether, or a combination thereof.

In the organic ligand solution, an amount of the organic solvent may be appropriately selected by considering an amount of a precursor, which will be described later, and the like but is not particularly limited.

In the organic ligand solution, an amount of the carboxylic acid compound may be determined based on an amount of a zinc precursor (e.g., in the precursor stock solution). In an embodiment, an amount of the carboxylic acid compound may be greater than or equal to about 0.1 mole, for example, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole, greater than or equal to about 1.1 moles, greater than or equal to about 1.2 moles, greater than or equal to about 1.3 moles, greater than or equal to about 1.4 moles, greater than or equal to about 1.5 moles, greater than or equal to about 1.6 moles, greater than or equal to about 1.7 moles, greater than or equal to about 1.8 moles, greater than or equal to about 1.9 moles, or greater than or equal to about 2 moles based on about 1 mole of the zinc precursor (e.g., in the precursor stock solution). Based on about 1 mole of the zinc precursor, the carboxylic acid compound may be used in an amount of less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, or less than or equal to about or 3 moles.

Based on about 1 mole of the zinc precursor (e.g., in the precursor stock solution), the primary amine compound may be used in an amount of greater than or equal to about 0.1 mole, for example, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole, greater than or equal to about 1.1 moles, greater than or equal to about 1.2 moles, greater than or equal to about 1.3 moles, greater than or equal to about 1.4 moles, greater than or equal to about 1.5 moles, greater than or equal to about 1.6 moles, greater than or equal to about 1.7 moles, greater than or equal to about 1.8 moles, greater than or equal to about 1.9 moles, or greater than or equal to about 2 moles. Based on 1 mole of the zinc precursor (e.g., in the precursor stock solution), the primary amine compound may be used in an amount of less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, or less than or equal to about 3 moles.

The organic ligand solution is heated at a first temperature under an inert atmosphere (e.g., a vacuum, nitrogen, or argon atmosphere). The first temperature may be appropriately selected with a consideration of a first reaction temperature (a first semiconductor nanocrystal-forming temperature), which will be described later. The first temperature may be greater than or equal to about 100° C., greater than or equal to about 110° C., greater than or equal to about 120° C., greater than or equal to about 130° C., greater than or equal to about 140° C., greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., greater than or equal to about 250° C., greater than or equal to about 260° C., or greater than or equal to about 270° C. The first temperature may be less than or equal to about 300° C. The first temperature may be changed within the above range.

The zinc precursor may include a Zn metal powder, an alkylated Zn compound (e.g., a C2 to C30 dialkyl zinc such as diethyl zinc), a Zn halide (e.g., zinc chloride), a Zn cyanide, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-tributylphosphine (Te-TBP), tellurium-triphenylphosphine (Te-TPP), tellurium-diphenylphosphine (Te-DPP), tellurium-trioctylphosphine (Te-TOP), or a combination thereof, but is not limited thereto.

The zinc precursor, the selenium precursor, optionally the tellurium precursor, and a second organic solvent are used to prepare a precursor stock solution. The second organic solvent is not particularly limited but appropriately selected, and for example can be any of the first organic solvents provided above. For example, the second organic solvent is the same as described in the organic ligand solution. The prepared precursor stock solution is added, for example injected, into the organic ligand solution heated (i.e., preheated) at the first temperature to obtain a first reaction mixture, and this first reaction mixture is then heated at the first reaction temperature to obtain a core including first semiconductor nanocrystals. The method may further include a step of separating the obtained core. For example, the step of separating the core may further include adding a non-solvent (described later) to a reaction system including the core for a precipitation and separating the precipitated core (in an appropriate method, for example, centrifugation and the like).

When the first reaction mixture includes tellurium, the selenium precursor may be included in an amount of greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 mol, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles based on one mole of the tellurium precursor. The selenium precursor may be used in an amount of less than or equal to about 60 moles, less than or equal to about 59 moles, less than or equal to about 58 moles, less than or equal to about 57 moles, less than or equal to about 56 moles, or less than or equal to about or 55 moles based on one mole of the tellurium precursor.

The first reaction temperature may be greater than or equal to about 280° C., for example, greater than or equal to about 290° C. The first reaction temperature may be less than or equal to about 340° C., for example, less than or equal to about 330° C. A reaction time for forming the core is not particularly limited but may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hour but is not limited thereto. The reaction time may be adjusted to control a size of the core within the above range.

A size, a shape, a light emitting wavelength, and the like of the core are the same as described above.

A shell-forming reaction under presence of the core, which is described later, is performed to obtain a quantum dot according to an embodiment. In an embodiment, a second semiconductor nanocrystal shell may be formed on the core by providing, for example preparing, a first shell precursor solution including a zinc-containing first shell precursor a second organic ligand, and a third organic solvent, and providing, for example preparing, a second shell precursor including at least one of sulfur and selenium, and heating the first shell precursor solution at a second reaction temperature, and adding the core and the second shell precursor thereto to form a shell of a second semiconductor nanocrystal on the core.

The first shell precursor may include a Zn metal powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., zinc chloride), a Zn cyanide, a Zn hydroxide, or a combination thereof. For example, the first shell precursor may include dimethyl zinc, diethyl zinc, zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, a zinc sulfate, or a combination thereof.

The second shell precursor may include selenium, sulfur, or a combination thereof. The sulfur-containing precursor of the second shell precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The selenium-containing precursor of the second shell precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

In an embodiment, after core synthesis, during shell growth, a solution including first or second shell precursors may be added to a reaction system in stages so that a composition of the shell may be changed or varied. For non-limiting examples, in the case that a shell of a ternary element (ABC) compound is formed, addition orders and amounts, and reaction times of an A element precursor (e.g., a metal element such as Zn), B element precursor (e.g., a first non-metal element such as sulfur), C element precursor (e.g., a second non-metal element such as Se) solutions may be controlled. For example, the core is added to the A element precursor solution, the B element precursor solution is added, and then a reaction is performed for a predetermined time. Subsequently, at least one of the C element precursor solution and the B element precursor solution may be added to the reaction system in a form of a mixture or individually and then a reaction is performed. Herein, addition times of the C element precursor solution and the B element precursor solution and a ratio of the precursors in the reaction system may be controlled.

A lattice mismatch at the interface of the core and shell may be controlled at a desirable time by controlling the addition times of the C element precursor solution and the B element precursor solution and a ratio of the precursors in the reaction system. In addition, growth energy at the surface may be controlled by changing a reaction temperature and a kind of the C element precursor.

The third organic solvent used for shell formation is not particularly limited and may be desirably selected. For example, the third organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a primary, secondary, or tertiary phosphine oxide (e.g. trioctylphosphine oxide) such as (e.g., 1, 2, or 3) substituted with a C6 to C22 alkyl group, a C12 to C22 aromatic ether such as a phenyl ether or a benzyl ether, or a combination thereof.

The second organic ligand may coordinate the surface of the produced nanocrystal and may have an effect on the light emitting and electric characteristics as well as may well disperse the nanocrystal in the solution phase. The second organic ligand may include, $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RHPOOH$, $RPO(OH)_2$, $R_2POOH$ (wherein, R and R' independently include a C1 to C40 substituted or unsubstituted aliphatic hydrocarbon, C6 to C40 substituted or unsubstituted aromatic hydrocarbon, or a combination thereof), or a combination thereof. The second ligand may be may be used alone or in a combination of two or more compounds.

Specific examples of the second organic ligand compound may be methanethiol, ethanethiol, propanethiol, butanethiol, pentanethiol, hexanethiol, octanethiol, dodecanethiol, hexadecanethiol, octadecanethiol, benzylthiol; methylamine, ethylamine, propylamine, butylamine, pentylamine, hexylamine, octylamine, dodecylamine, hexadecylamine, oleylamine, octadecylamine, dimethylamine, diethylamine, dipropylamine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphines such as methylphosphine, ethylphosphine, propylphosphine, butylphosphine, pentylphosphine, tributylphosphine, or trioctylphosphine; a phosphine compound or an oxide compound thereof such as methylphosphine oxide, ethylphosphine oxide, propylphosphine oxide, butylphosphine oxide, or trioctylphosphine oxide; a diphenylphosphine or triphenylphosphine compound, or an oxide compound thereof; phosphonic acid, or the like, but are not limited thereto. The second organic ligand compound may be used alone or in a mixture of two or more compounds. In an embodiment, the second organic ligand compound may be a combination of RCOOH and an amine (e.g., $RNH_2$, $R_2NH$, and/or $R_3N$).

Reaction conditions such as a second reaction temperature or time for shell formation is not particularly limited and may be selected appropriately. In a non-limiting example embodiment, under a vacuum, a third organic solvent and optionally the second organic ligand compound and the first shell precursor are heated (or vacuum-treated) at a predetermined temperature (e.g., greater than or equal to about 100° C.), and are heated again at predetermined temperature (e.g., greater than or equal to about 100° C., greater than or equal to about 150° C., greater than or equal to about 200° C., or greater than or equal to about 210° C.) under an inert gas atmosphere. Subsequently, the core is added, shell precursors (e.g., chalcogen element-containing shell precursors) are sequentially or simultaneously added, and then heated at a predetermined reaction temperature (e.g., a second reaction temperature) to perform a reaction.

The shell precursors may be sequentially added as a mixture of different ratios during a reaction time.

After completing the reaction, a nonsolvent is added to reaction products and nanocrystal particles coordinated with the ligand compound may be separated (e.g., precipitated). The nonsolvent may be a polar solvent that is miscible with the organic solvent used in the core formation and/or shell formation reactions and is not capable of dispersing the produced nanocrystals therein. The nonsolvent may be selected depending the organic solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The nanocrystal particles may be separated through centrifugation, sedimentation, chromatography, or distillation. The separated nanocrystals may be added to a washing solvent and washed, if necessary. The washing solvent has no particular limit and may have a similar solubility parameter to that of the ligand and may, for example, include hexane, heptane, octane, chloroform, toluene, benzene, or the like.

In another embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescence element (e.g., a lighting such as a quantum dot sheet or a quantum dot rail or a liquid crystal display (LCD)) or an electroluminescent device (e.g., QD LED). In a non-limiting embodiment, the electronic device may include a quantum dot sheet and the semiconductor nanocrystal particle may be included in the quantum dot sheet (e.g., in a form of a semiconductor nanocrystal-polymer composite).

In a non-limiting embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 2).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, calcium, or LiF), a metal compound, an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may include, for example, a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, it may include, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 um, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to the embodiments. The quantum dot emission layer may include a monolayer of the blue light emitting semiconductor nanocrystal particles.

The quantum dot emission layer may be formed by preparing a dispersion including the quantum dots dispersed in a solvent, applying the dispersion via spin coating, ink jet coating, or spray coating, and drying the same. The emissive layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

Figure 2:
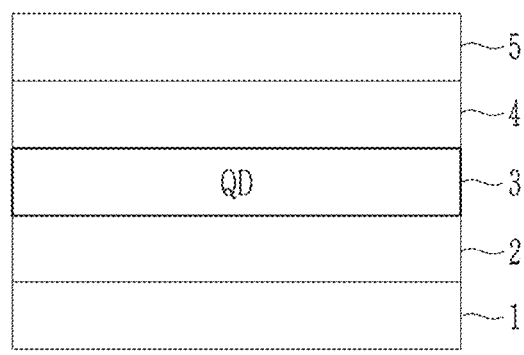
FIG. 2 is a schematic cross-sectional view showing a QD LED device according to a non-limiting embodiment.

The electronic device may include charge (hole or electron) auxiliary layers between the anode and the cathode. For example, as shown in FIG. 2, the electronic device may include a hole auxiliary layer 2 or an electron auxiliary layer 4 between the anode and the quantum dot emission layer and/or between the cathode and the quantum dot emission layer.

In the figures, the electron/hole auxiliary layer is formed as a single layer, but it is not limited thereto and may include a plurality of layers including at least two stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer that is formed by a solution process (e.g., spin coating etc.) such as PEDOT:PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The electron injection layer may be an organic layer formed by deposition (e.g., vapor deposition). The electron transport layer may include an inorganic oxide or a (nano or fine) particles thereof or may include an organic layer formed by deposition.

The quantum dot emission layer may be disposed in or on the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer may include, each independently, for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole, PVK), polyaniline, polypyrrole, N,N,N',N'-tetrakis (4-methoxyphenyl)-benzidine (TPD), 4,4',-bis[N-(1-naphthyl)-N-phenyl-amino]biphenyl (α-NPD), m-MTDATA (4,4',4''-tris[phenyl(m-tolyl)amino]triphenylamine), 4,4',4''-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), p-type metal sulfide (e.g., ZnS), a carbonaceous material such as graphene oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N, N, N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), or a combination thereof, but is not limited thereto.

The electron transport layer (ETL) and/or the electron injection layer (EIL) may, each independently, include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), or a combination thereof, but is not limited thereto. The n-type metal oxide may be (crystalline) nanoparticles. The electron transport layer (ETL) may include crystalline nanoparticles including a zinc oxide compound (e.g., ZnO).

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

In the foregoing "q" is 8-hydroxyquinoline, "BTZ" is 2-(2-hydroxyphenyl)benzothiazolate, and "Bq" is 10-hydroxybenzo[h]quinoline. The n-type metal oxide may be crystalline.

Figure 3A:
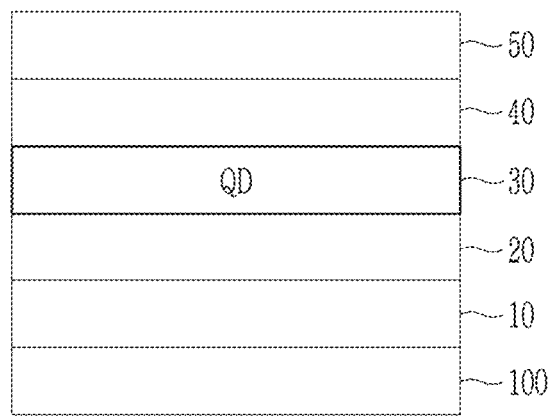
FIG. 3A is a schematic cross-sectional view showing a QD LED device according to a non-limiting embodiment.

A device according to an embodiment as shown in FIG. 3a may have a normal structure (e.g., a non-inverted structure). In the device, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. For example, a hole auxiliary layer 20 (e.g., a hole transport layer including TFB and/or PVK and/or a hole injection layer including PEDOT:PSS and/or a p-type metal oxide) may be disposed between the transparent electrode 10 and the emission layer 30. An electron auxiliary layer (e.g., electron transport layer) 40 may be disposed between the quantum dot emission layer 30 and the cathode 50.

Figure 3B:
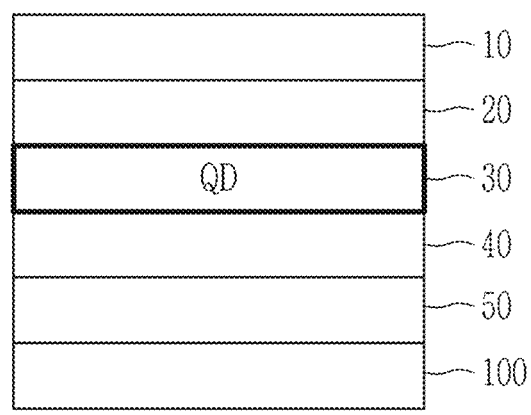
FIG. 3B is a schematic cross-sectional view showing a QD LED device according to a non-limiting embodiment.

A device according to an embodiment as shown in FIG. 3b has an inverted structure. In the device of the embodiments, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB and/or PVK and/or a hole injection layer including $MoO_3$ or another p-type metal oxide) may be disposed between the metal anode 10 and the quantum dot emission layer 30. Hereinafter, examples are illustrated. However, these examples are exemplary, and the present disclosure is not limited thereto.

Hereinafter, specific examples are illustrated. However, these examples are exemplary, and the present disclosure is not limited thereto.

EXAMPLES

Analysis Method

[1] Photoluminescence Analysis

Photoluminescence (PL) spectra of the produced nanocrystals are obtained using a Hitachi F-7000 spectrometer at an irradiation wavelength of 372 nm.

[2] UV Spectroscopy Analysis

A UV spectroscopy analysis is performed by using a Hitachi U-3310 spectrometer to obtain a UV-Visible absorption spectrum.

[3] TEM Analysis (1) Transmission electron microscope photographs of nanocrystals are obtained using an UT F30 Tecnai electron microscope.

(2) A transmission electron microscopy energy-dispersive X-ray spectroscopy (TEM-EDX) analysis (elemental mapping) is performed using an UT F30 Tecnai electron microscope.

[4] ICP Analysis

An inductively coupled plasma-atomic emission spectroscopy (ICP-AES) analysis is performed using Shimadzu ICPS-8100.

[5] HRTEM Analysis

A high-resolution transmission electron microscopy (HR-TEM) analysis is performed using TEM-Titan G2.

[6] X-ray Diffraction (XRD) Analysis

A XRD analysis is performed using a Philips XPert PRO equipment with a power of 3 kW to confirm crystal structures of the semiconductor nanocrystals.

A synthesis is performed under an inert gas atmosphere (nitrogen flowing condition) unless particularly mentioned.

[7] Time Resolved Spectroscopic Analysis

Time Resolved Spectroscopic Analysis is performed by using a fluorescence lifetime spectrometer made by Picoquant.

Synthesis of Quantum Dot

Example 1: Production of ZnTeSe Core

Selenium and tellurium are dispersed in trioctylphosphine (TOP) to prepare a 2 molar (M) Se/TOP solution and a 0.1 M Te/TOP solution. In addition, a hexane solution of 1 M diethyl zinc is obtained. The Se/TOP solution, the Te/TOP solution, and the hexane solution of diethyl zinc are mixed to obtain a precursor mixture solution. In the precursor mixture solution, contents of Se and Te per 1 mole of zinc are adjusted to 0.8 mol and 0.03 moles, respectively.

Trioctylamine is placed in a 300 milliliter (mL) reaction flask, and oleic acid (OA) and hexadecylamine (HDA) are respectively added to the flask in at a ratio of 2.5 moles per 1 mole of a zinc precursor (i.e., diethyl zinc). After converting atmosphere in the flask into nitrogen, the flask is heated at 280° C. for 10 minutes to obtain an organic ligand solution.

The precursor mixture solution is added to the heated organic ligand solution, and the mixture is heated up to 300° C. and a reaction proceeds at the same temperature for 40 minutes. After the reaction, the reaction solution is rapidly cooled down to room temperature (ca. 23° C.), ethanol is added thereto, and the obtained mixture is centrifuged to recover ZnSeTe core particles. The recovered ZnSeTe core particles are subsequently dispersed in toluene.

Comparative Example 1: Production of ZnTeSe Core

Zinc acetate, oleic acid, and hexadecylamine are dissolved in trioctylamine in a reactor and then, heated at 120° C. One hour later, an atmosphere in the reactor is converted into nitrogen. After heating the reactor at 300° C., a mixture of the Se/TOP solution and the Te/TOP solution prepared in the same method as Example 1 is rapidly injected thereinto and then, reacted with the reactant therein for 40 minutes. A content/ratio of a precursor and an organic ligand with a solvent are the same as Example 1.

The reaction solution is rapidly cooled down to room temperature (ca. 23 OC), ethanol is added thereto, and the mixture is centrifuged to obtain a core-shell quantum dot, and the core-shell quantum dot is dispersed in toluene.

Example 2: Formation of ZnSeS/ZnS Shell

Trioctylamine is put in a 300 mL flask. 0.6 mmol of zinc acetate and oleic acid are added thereto, and the mixture is vacuum-treated at 120° C. for 10 minutes. An amount of the oleic acid is twice as much as that of the zinc acetate. The atmosphere in the flask is replaced with nitrogen ($N_2$), and the reactor is heated to 180° C. The ZnTeSe core prepared in Example 1 (reaction time: 40 minutes) is rapidly added thereto, and the mixture is heated to 320° C. while Se/TOP and S/TOP are added thereto and a reaction proceeds. During the reaction, the Se/TOP and S/TOP are added thereto once every 20 minutes, respectively. At the initial injection, the injected amount of Se/TOP is larger than that of S/TOP while at the final injection, the injected amount of the Se/TOP is smaller than that of S/TOP. A total of the injected amount of Se is 0.4 millimoles (mmol), and a total of the injected amount of S is 0.8 mmol.

When the reaction is complete, the reactor is cooled down, ethanol is added to the reaction solution at room temperature, the mixture is centrifuged to obtain core-shell quantum dots, and the core-shell quantum dots are dispersed in toluene.

Comparative Example 2: Formation of ZnSeS/ZnS Shell

A ZnSeS/ZnS shell is formed in the same method as Example 2 except for using the ZnTeSe core according to Comparative Example 1 instead of the ZnTeSe core according to Example 1. When the reaction is complete, the reactor is cooled down, ethanol is added to the reaction solution at room temperature, the mixture is centrifuged to obtain a core-shell quantum dot, and the core-shell quantum dot is dispersed in toluene.

Example 3

A core-shell quantum dot is prepared according to the same method as Example 2 except for using 0.8 mmol of S/TOP (with a reference to an amount of sulfur) and changing the reaction time into 120 minutes. The obtained quantum dot is dispersed in toluene.

Analysis of Quantum Dot Characteristics

Experimental Example 1-1

Figure 4:
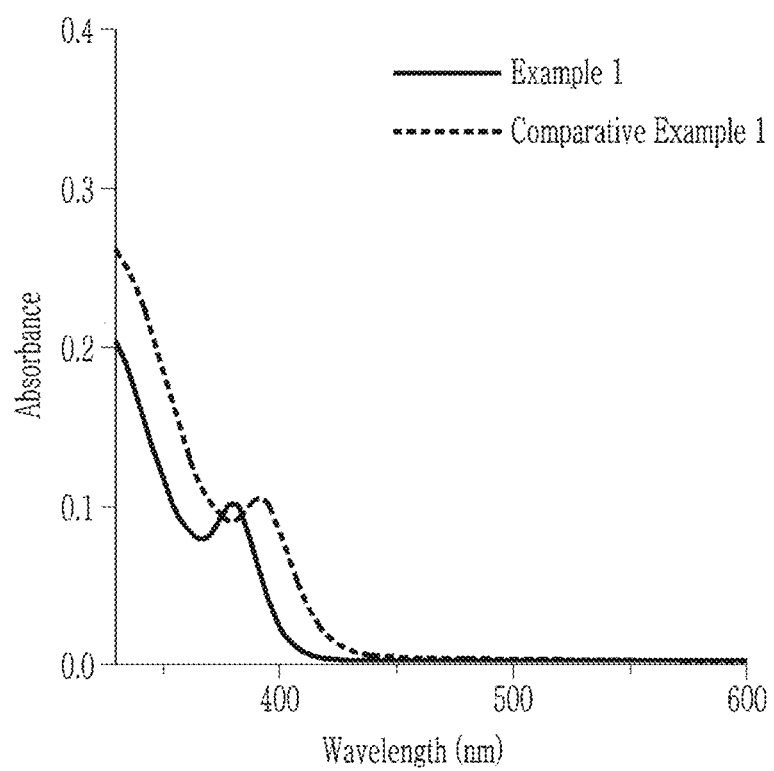
FIG. 4 is a graph of absorbance (arbitrary units) versus wavelength (nanometers, nm), and shows UV-Vis absorption spectra of ZnTeSe cores produced in Example 1 and Comparative Example 1.

The ZnSeTe core particles according to Example 1 and Comparative Example 1 are examined through UV-vis spectroscopy and photoluminescence spectroscopy, and the results are shown in FIG. 4. Referring to the results of FIG. 4, the core particle according to Example 1 has a first absorption wavelength at 380 nm, but the core particle according to Comparative Example 1 has a first absorption wavelength at 390 nm. This result shows that the ZnSeTe core particle according to Example 1 has a smaller size.

Experimental Examples 1 and 2

Figure 15:
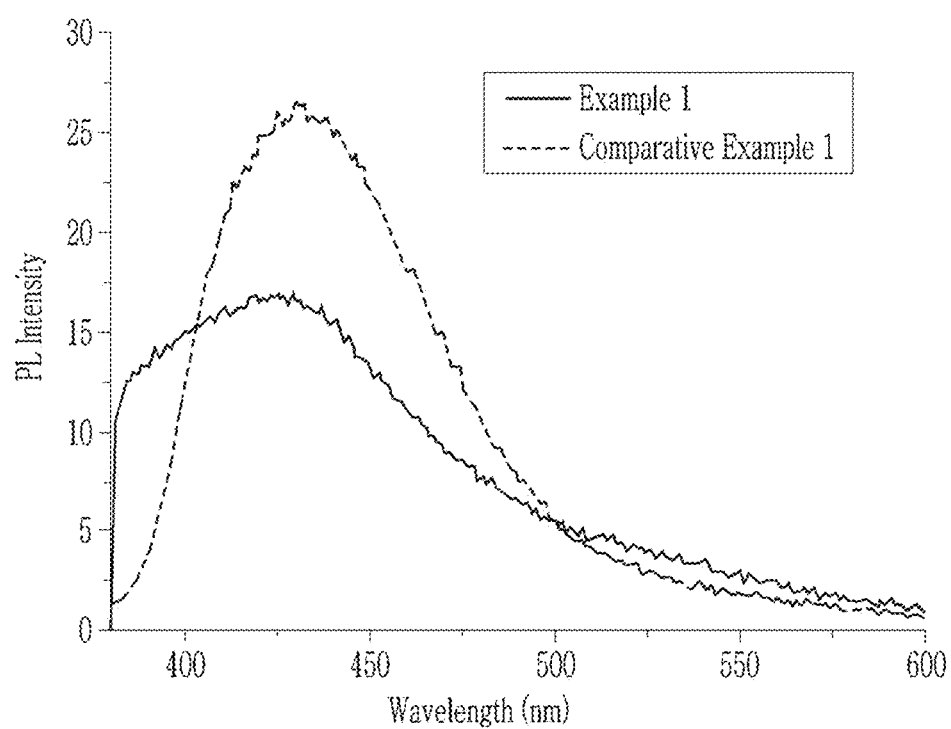
FIG. 15 is a graph of photoluminescence (PL) intensity (arbitrary units) versus wavelength (nm), and shows a photoluminescence spectrum of the core produced in Example 1 and Comparative Example 1.

An photoluminescence analysis regarding the ZnSeTe core particle according to Example 1 and the ZnSeTe core particle according to Comparative Example 1 is performed, and the results are shown in FIG. 15. As a result, the core particle of Example 1 has a light emitting wavelength of 420 nm (Efficiency: 12%, Full width at half maximum (FWHM): 94 nm), and the ZnSeTe core particle of Comparative Example 1 has a light emitting wavelength of 433 nm (Efficiency: 15%, Full width at half maximum (FWHM): 72).

Experimental Example 2

Figure 5:
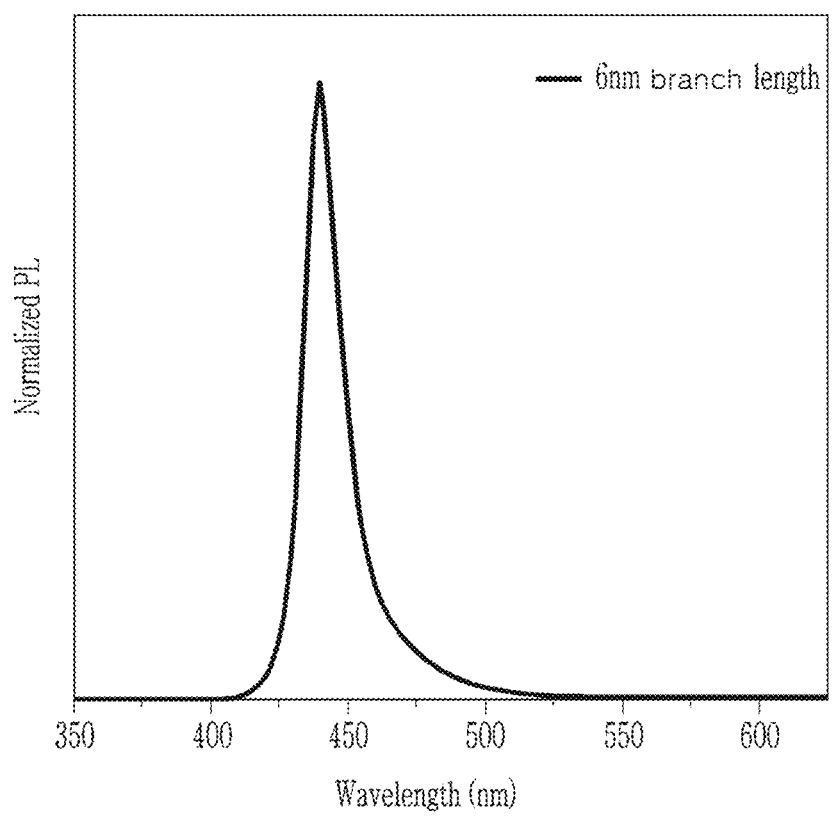
FIG. 5 is a graph of normalized photoluminescence (PL) (arbitrary units) versus wavelength (nm), and shows a photoluminescence spectrum of the core-shell quantum dot produced in Example 2.
Figure 8:
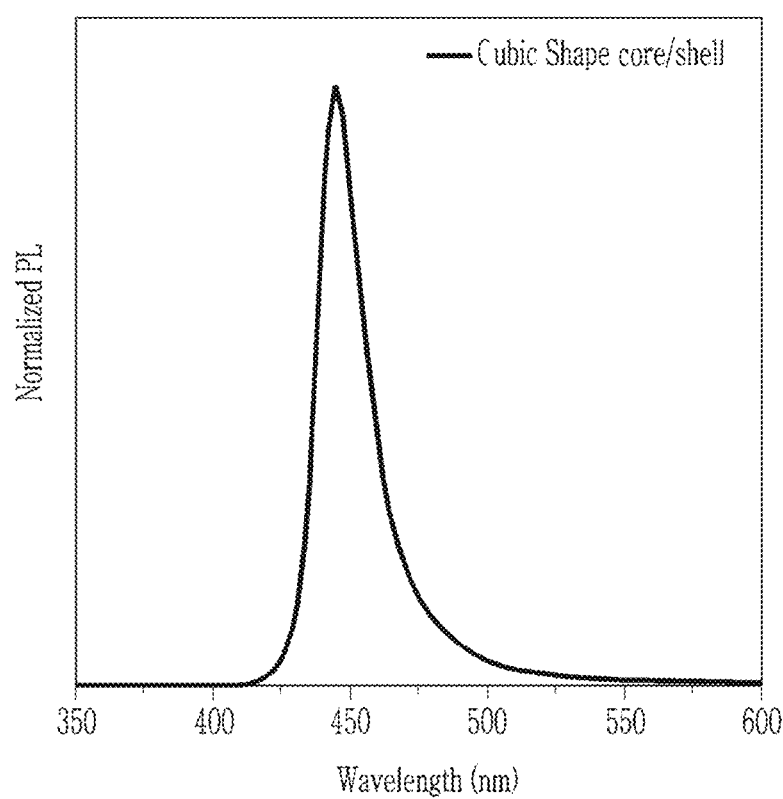
FIG. 8 is a graph of normalized photoluminescence (PL) (arbitrary units) versus wavelength (nm), and shows a photoluminescence spectrum of the core-shell quantum dot produced in Comparative Example 2.

A photoluminescence analysis regarding the core-shell quantum dots according to Example 2 and Comparative Example 2 is performed, and the results are respectively shown in FIGS. 5 and 8 and Table 1. The results show that the core-shell quantum dot of Example 2 has an increased maximum light emitting wavelength and improved luminous efficiency compared with those of Comparative Example 2.

Experimental Example 3

Figure 6:
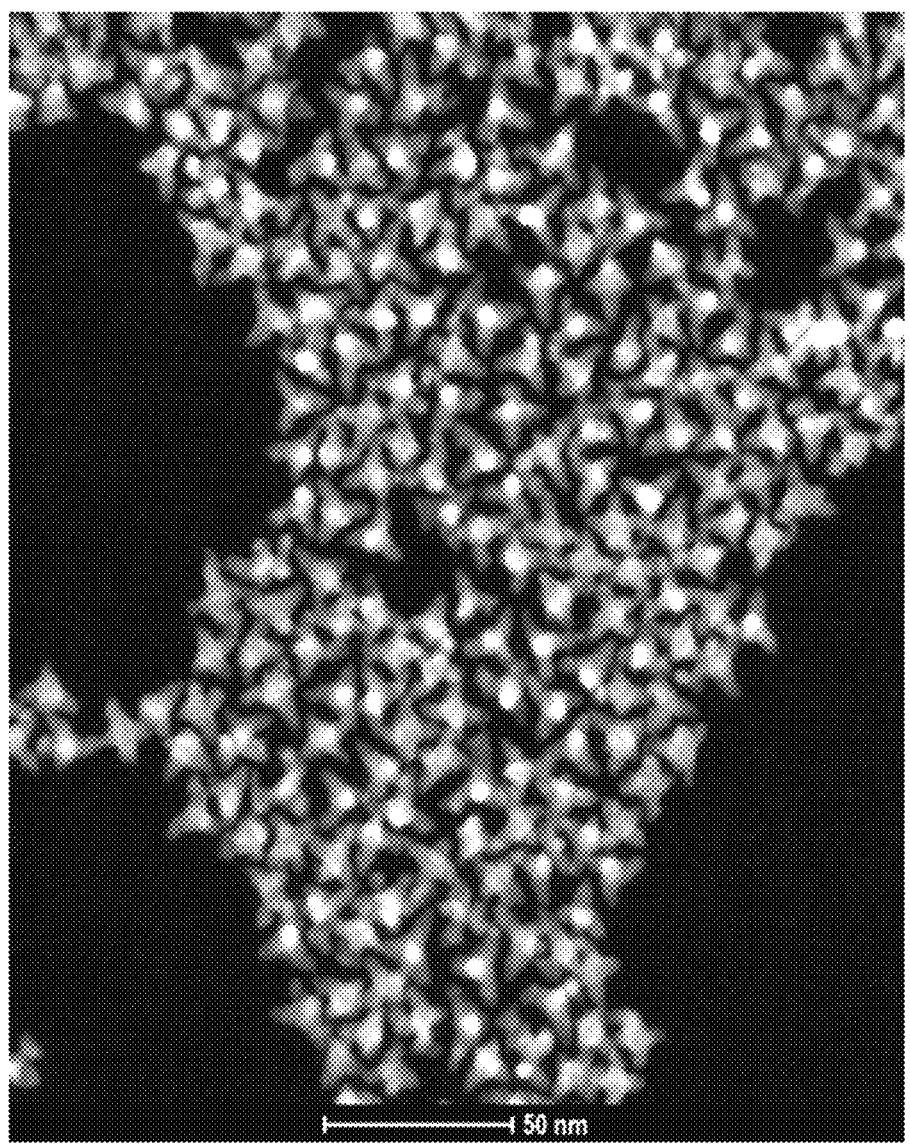
FIG. 6 shows a transmission electron microscope (TEM) image of the core-shell quantum dot produced in Example 2.
Figure 9:
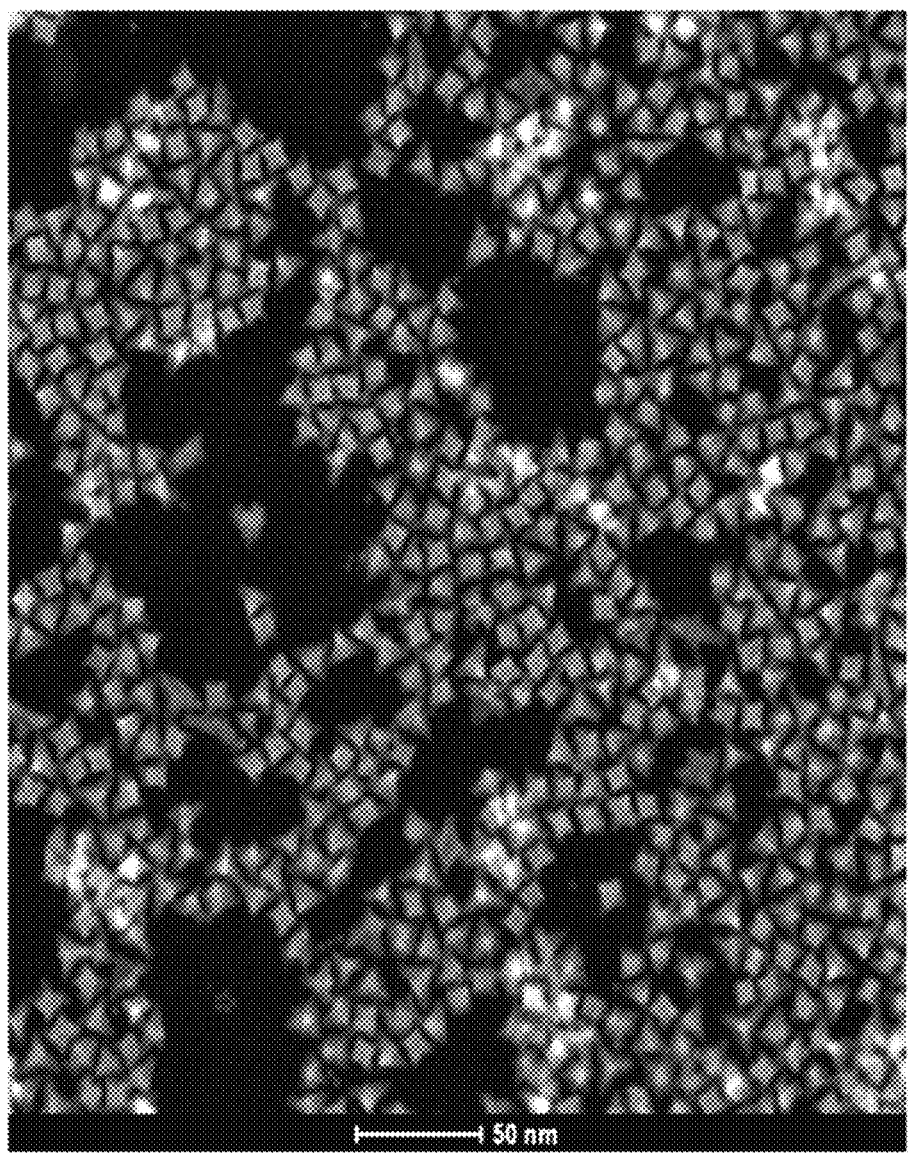
FIG. 9 shows a transmission electron microscope (TEM) image of the core-shell quantum dot produced in Comparative Example 2.

[1] A transmission electron microscope analysis regarding the core-shell quantum dots according to Example 2 and Comparative Example 2 is performed, and the results are shown in FIGS. 6 and 9. Referring to the results, the core-shell quantum dot of Example 2 has a branch length of greater than 2 nm (a maximum length of 10 nm, an average length of 4.55 nm), and the core-shell quantum dot of Comparative Example 2 has a branch length of less than or equal to 2 nm (an average length of 1.84 nm).

Figure 7:
FIG. 7 shows a high-resolution transmission electron microscopy (HRTEM) image of the core-shell quantum dot produced in Example 2.

[2] A HRTEM analysis regarding the core-shell quantum dot of Example 2 is performed, and the results are shown in FIG. 7. Referring to the results of FIG. 7, a shell disposed on a core may include a valley between greater than or equal to three branches having a length of greater than 2 nm and their neighboring branches.

Experimental Example 4

Figure 11:
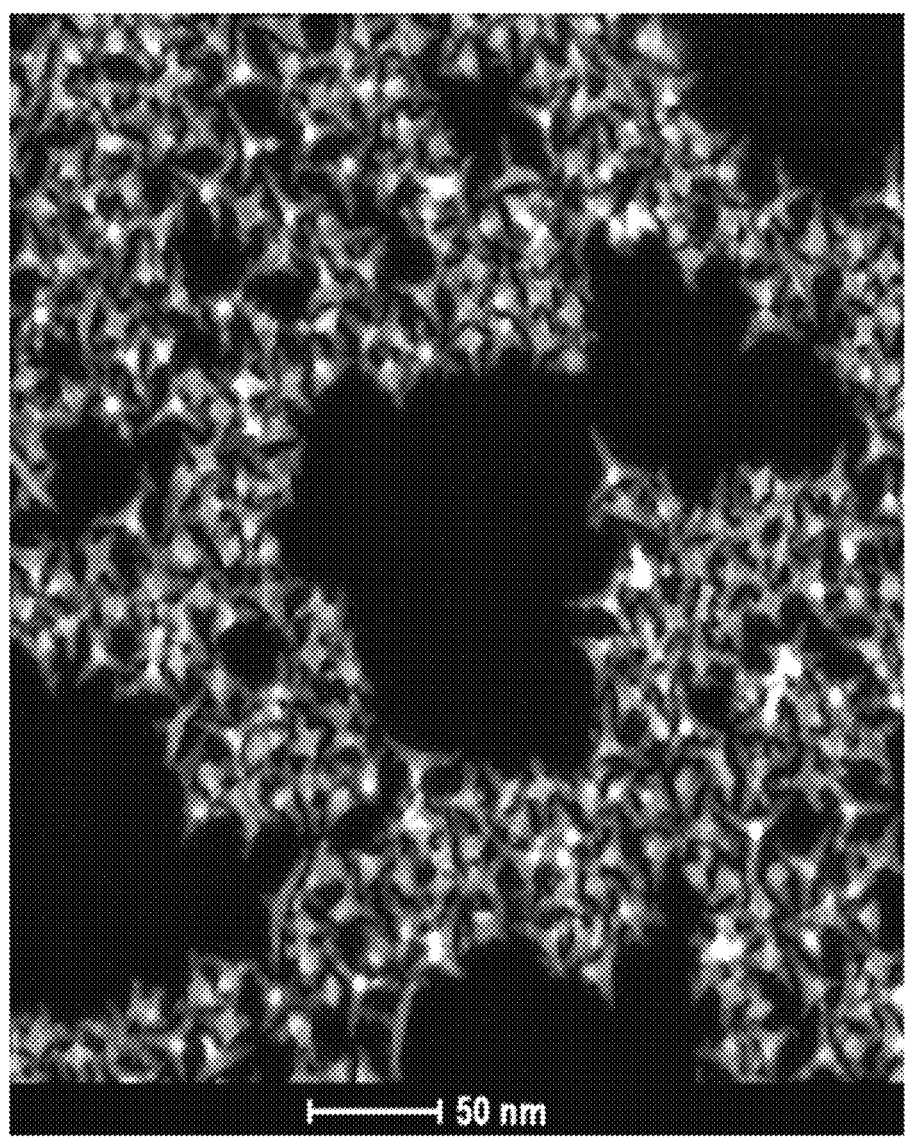
FIG. 11 shows a transmission electron microscope photograph of the core-shell quantum dot produced in Example 3.

A transmission electron microscope analysis regarding the core-shell quantum dot of Example 3 is performed, and the result is shown in FIG. 11. Referring to FIG. 11, the quantum dot includes a branch having a length of 6 to 7 nm (an average length: 6.75 nm).

Figure 10:
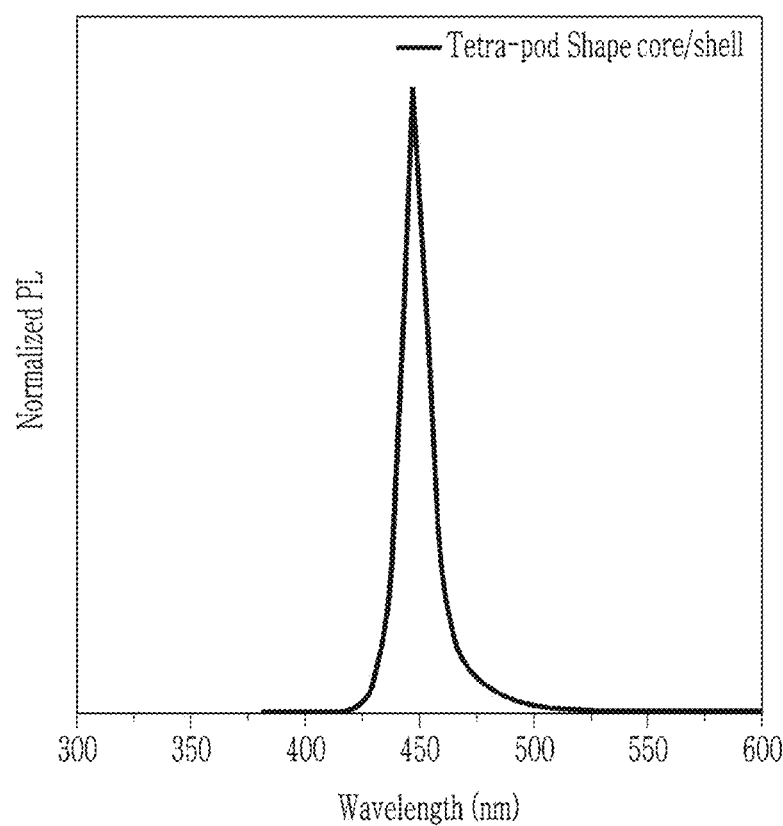
FIG. 10 is a graph of normalized photoluminescence (PL) (arbitrary units) versus wavelength (nm), and shows a photoluminescence spectrum of the core-shell quantum dot produced in Example 3.

A photoluminescence spectroscopy regarding the core-shell quantum dot of Example 3 is performed, and the results are shown in FIG. 10 and Table 1.

Experimental Example 5

Figure 12:
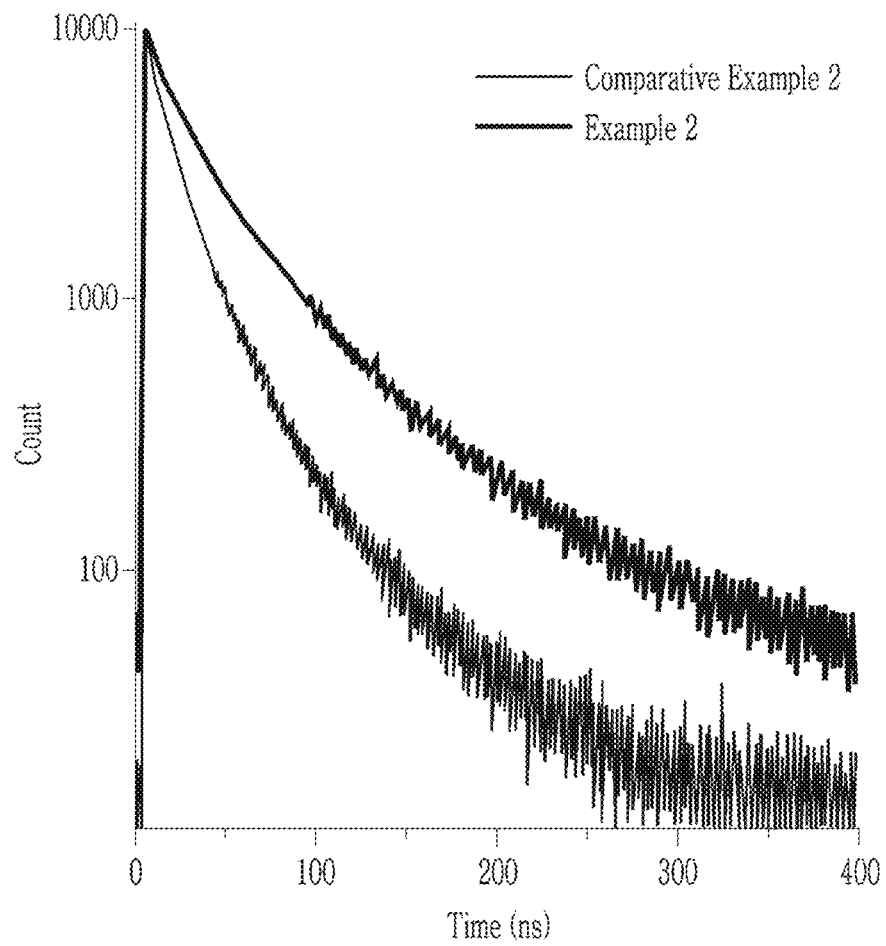
FIG. 12 shows time resolved spectroscopic analysis results of the quantum dots produced in Example 2 and Comparative Example 2.

A time resolved spectroscopic analysis regarding the quantum dots according to Examples 2 and 3 and Comparative Example 2 is performed, and the results are shown in FIG. 12 and Table 1. The results show that the quantum dots of Examples has a longer lifetime than those of Comparative Example.

TABLE 1

| | Branch average length (nm) | Wavelength of maximum photoluminescence peak (nm) | Full width at half maximum (FWHM) (nm) | Quantum efficiency (%) | Lifetime (ns) |
|---|---|---|---|---|---|
| Example 2 | 4.55 | 444 | 16 | 72 | 24 |
| Comparative Example 2 | 1.84 | 441 | 25 | 68 | 16 |
| Example 3 | 6.75 | 450 | 10 | 80 | 32 |

Experimental Example 6

Inductively coupled plasma-atomic emission spectroscopy (ICP-AES) regarding the core-shell quantum dot of Example 2 is performed, and the results are shown in Table 2.

TABLE 2

| Sample (ICP-AES) | Mole ratio | | | | Mole ratio (X/Zn) | | | | (S + Se)/Zn |
|---|---|---|---|---|---|---|---|---|---|
| | S | Zn | Se | Te | S | Zn | Se | Te | |
| Tetrapodshaped QD | 0.284 | 0.531 | 0.183 | 0.001 | 0.535 | 1.000 | 0.345 | 0.002 | 0.88 |

Experimental Example 7

Figure 13:
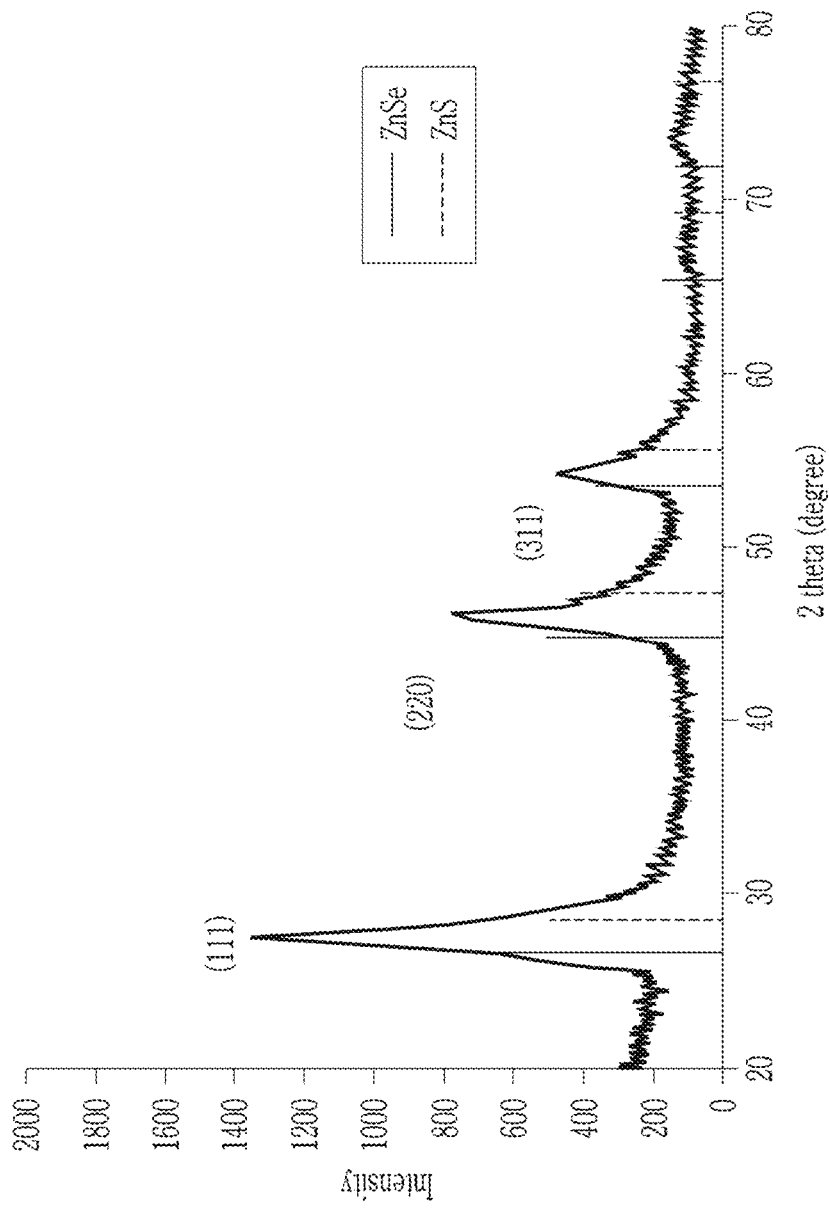
FIG. 13 shows an X-ray diffraction analysis result of the core-shell quantum dot produced in Example 2.

An X-ray diffraction analysis regarding the synthesized core-shell quantum dot of Example 2 is performed, and the results are shown in FIG. 13. Referring to the results of FIG. 13, the synthesized quantum dot turns out to have a zinc blend (cubic) structure.

Experimental Example 8

Figure 14:
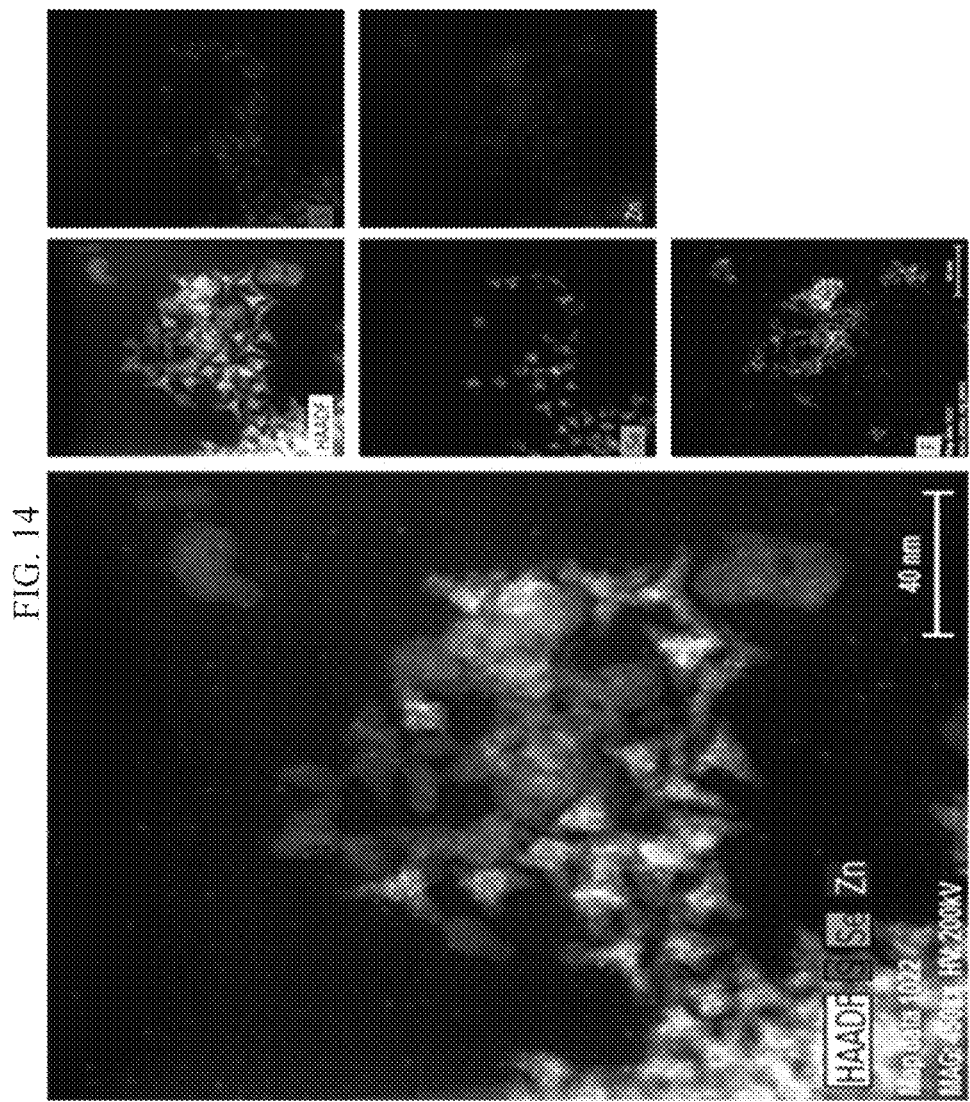
FIG. 14 is a color image that shows a transmission electron microscopy energy-dispersive X-ray spectroscopy (TEM-EDX) element mapping result of the quantum dot produced in Example 2.

A TEM-EDX analysis (element mapping) regarding the core-shell quantum dot of Example 2 is performed, and the results are shown in FIG. 14. Referring to FIG. 14, the shell richly includes S in an outer layer of a particle.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising:
   a core comprising a first semiconductor nanocrystal comprising zinc, selenium, and tellurium; and
   a shell disposed on the core and comprising a second semiconductor nanocrystal having a different composition from the first semiconductor nanocrystal, and comprising zinc and at least one of sulfur and selenium,
   wherein the shell comprises at least three branches extending from the core, wherein at least one of the branches has a length of greater than or equal to about 2 nanometers,
   wherein the quantum dot emits blue light comprising a maximum emission peak at a wavelength of less than or equal to about 470 nanometers,
   wherein a full width at half maximum (FWHM) of the maximum emission peak is less than about 25 nanometers, and
   wherein the quantum dot does not comprise cadmium.

2. The quantum dot of claim 1, wherein the first semiconductor nanocrystal comprises ZnSe, $ZnTe_xSe_{1-x}$ wherein x is greater than 0 and less than or equal to 0.05, or a combination thereof.

3. The quantum dot of claim 1, wherein a particle size of the core is less than about 3.5 nanometers.

4. The quantum dot of claim 1, wherein the shell comprises ZnSe, ZnS, ZnSeS, or a combination thereof.

5. The quantum dot of claim 1, wherein in the quantum dot, a mole ratio of tellurium relative to selenium is less than or equal to about 0.03.

6. The quantum dot of claim 1, wherein in the quantum dot, a mole ratio of tellurium relative to zinc is less than or equal to about 0.03.

7. The quantum dot of claim 1, wherein the branches have a composition that changes in a length direction.

8. The quantum dot of claim 7, wherein the branches have a composition where a sulfur content is increased along the length direction from the core.

9. The quantum dot of claim 1, wherein the branches have an average length of greater than or equal to about 3 nanometers.

10. The quantum dot of claim 1, wherein the branches have an average length of greater than or equal to about 4 nanometers.

11. The quantum dot of claim 1, wherein the quantum dot has a maximum emission peak at a wavelength of greater than or equal to about 430 nanometers and less than or equal to about 470 nanometers, and a full width at half maximum (FWHM) of the maximum emission peak is less than or equal to about 25 nanometers.

12. The quantum dot of claim 11, wherein the full width at half maximum (FWHM) of the maximum emission peak is less than or equal to about 20 nanometers.

13. The quantum dot of claim 1, wherein the quantum dot has quantum efficiency of greater than or equal to about 60%.

14. The quantum dot of claim 1, wherein the core and the shell have a zinc blend crystal structure.

15. A method of producing the quantum dot of claim 1, the method comprising
providing an organic ligand solution comprising a first organic ligand comprising a carboxylic acid compound and a primary amine compound, and a first organic solvent;
heating the organic ligand solution to a first temperature under an inert atmosphere;
providing a precursor stock solution comprising a zinc precursor, a selenium precursor, and optionally a tellurium precursor, and a second organic solvent;
adding the precursor stock solution to the organic ligand solution heated to the first temperature to obtain a first reaction mixture;
heating the first reaction mixture to a first reaction temperature to obtain a core comprising a first semiconductor nanocrystal;
providing a first shell precursor solution comprising a zinc-containing first shell precursor, a second organic ligand, and a third organic solvent;
providing a second shell precursor comprising at least one of sulfur and selenium; and
heating the first shell precursor solution and adding the core and the second shell precursor thereto to form a shell of a second semiconductor nanocrystal on the core.

16. The method of claim 15, wherein the zinc precursor comprises a Zn metal powder, an alkylated Zn compound, a Zn halide, a Zn cyanide, or a combination thereof, the selenium precursor comprises selenium-trioctylphosphine (Se-TOP), selenium-tributylphosphine (Se-TBP), selenium-triphenylphosphine (Se-TPP), selenium-diphenylphosphine (Se-DPP), or a combination thereof,
the tellurium precursor comprises tellurium-tributylphosphine (Te-TBP), tellurium-triphenylphosphine (Te-TPP), tellurium-diphenylphosphine (Te-DPP), tellurium-trioctylphosphine (Te-TOP), or a combination thereof,
the zinc-containing first shell precursor comprises a Zn metal powder, ZnO, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, or a combination thereof, and
the second shell precursor comprises selenium-trioctylphosphine (Se-TOP), selenium-tributylphosphine (Se-TBP), selenium-triphenylphosphine (Se-TPP), selenium-diphenylphosphine (Se-DPP), tellurium-tributylphosphine (Te-TBP), tellurium-triphenylphosphine(Te-TPP), tellurium-diphenylphosphine (Te-DPP), tellurium-diphenylphosphine (Te-DPP), or a combination thereof.

17. The method of claim 15, wherein an amount of the selenium precursor is greater than or equal to about 20 moles and less than or equal to about 60 moles based on 1 mole of the tellurium precursor.

18. The method of claim 15, wherein the first temperature is about 100° C. to about 300° C., and
the first reaction temperature is about 280° C. to about 340° C. and is higher than the first temperature, and
the shell is formed at a second reaction temperature and the second reaction temperature is about 300° C. to about 340° C.

19. The method of claim 15, wherein the carboxylic acid compound comprises a C5 to C30 aliphatic hydrocarbon group, and the primary amine compound comprises a C5 to C30 aliphatic hydrocarbon group.

20. An electronic device comprising the quantum dot of claim 1.

* * * * *